United States Patent [19]
Varrasso

[11] 3,984,611
[45] Oct. 5, 1976

[54] METHOD OF AND APPARATUS FOR MONITORING FOR ICIPIENT ELECTRODE FAILURE IN THE JOULE EFFECT HEATING OF HEAT SOFTENABLE MATERIAL

[75] Inventor: Eugene C. Varrasso, Heath, Ohio

[73] Assignee: Owens-Corning Fiberglas Corporation, Toledo, Ohio

[22] Filed: Nov. 10, 1975

[21] Appl. No.: 630,841

Related U.S. Application Data

[63] Continuation of Ser. No. 514,549, Oct. 15, 1974, abandoned.

[52] U.S. Cl. .......................................... 13/6; 13/24
[51] Int. Cl.² ........................................... C03B 5/24
[58] Field of Search ............................ 13/6, 23, 24

[56] References Cited
UNITED STATES PATENTS

| | | | |
|---|---|---|---|
| 3,176,215 | 3/1965 | Kusko | 323/94 H X |
| 3,585,267 | 6/1971 | Obersby | 13/6 |

Primary Examiner—R. N. Envall, Jr.
Attorney, Agent, or Firm—John W. Overman; Ralph J. Skinkiss; David H. Wilson

[57] ABSTRACT

A method of anticipating electrode failure by monitoring the current, voltage and resistance between electrode pairs in a Joule effect heating system. A relatively rapid change in monitored resistance is an indication of an incipient failure. Alarm indicators, instruction print out, and/or process controls can be actuated in response to a given current voltage or resistance change. Plural electrode pairs are monitored by multiplexing to provide a repetitive cyclic scan of the parameters between pairs. Distortion of current and voltage values is minimized, where selective portions of regular power pulses are gated for control of heating, and complex waveforms result by employing true r.m.s. values of current and voltage developed in true r.m.s. to d.c. converters.

19 Claims, 2 Drawing Figures

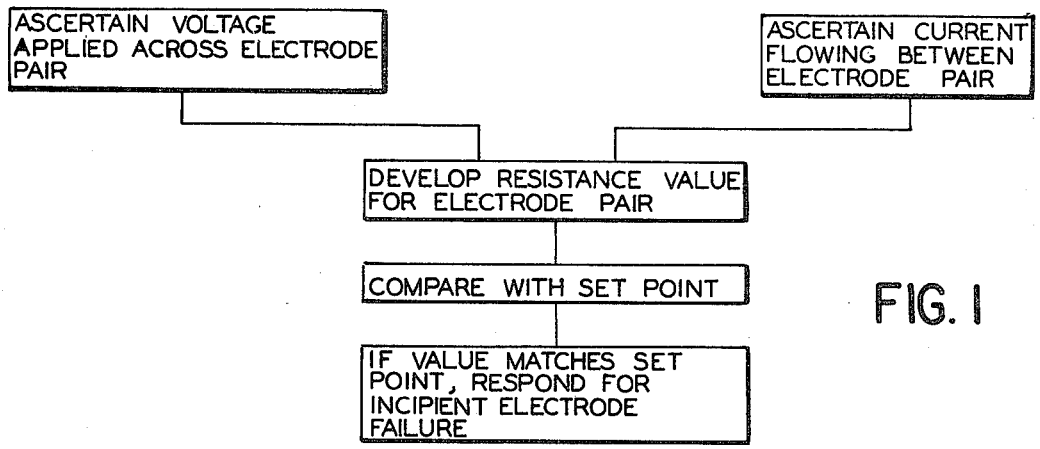
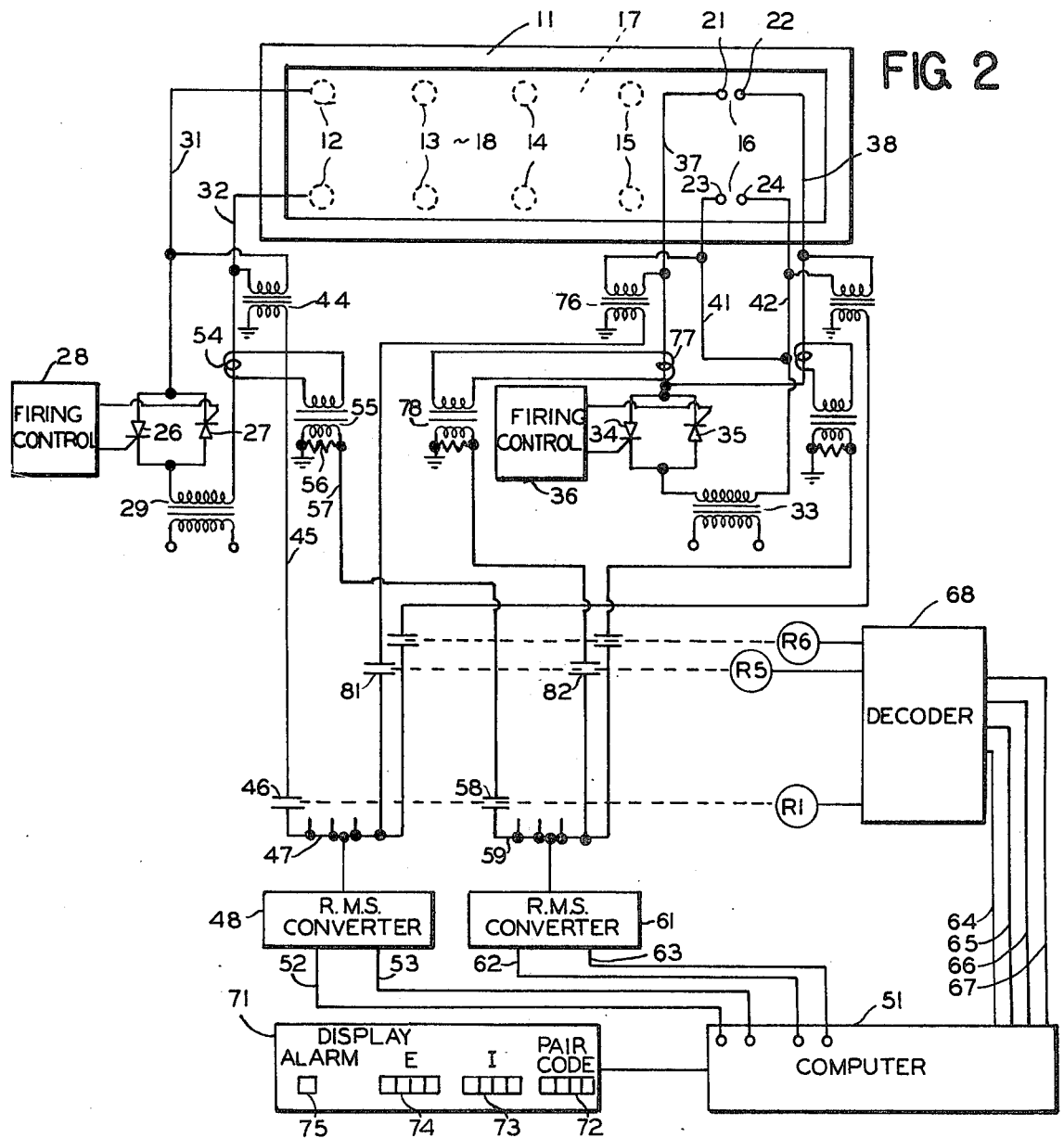

METHOD OF AND APPARATUS FOR MONITORING FOR ICIPIENT ELECTRODE FAILURE IN THE JOULE EFFECT HEATING OF HEAT SOFTENABLE MATERIAL

This is a continuation of application Ser. No. 514,549, filed Oct. 15, 1974, now abandoned.

BACKGROUND OF THE INVENTION

1. Field of the Invention

This invention relates to the monitoring of processing apparatus and more particularly to methods of and apparatus for monitoring for conditions indicative of incipient electrode or refractory wall failure in a heating and melting apparatus for Joule effect heated heat softenable material.

2. Description of the Prior Art

The electrical heating of heat softenable materials by Joule effect involves establishing electrical current communication with the material through electrodes. A typical heat softenable material, glass, has been maintained at or above the usual working temperatures, about 2600°F, by immersing one or more pair of electrodes in the molten glass and passing controlled pulses of electrical power from the electrodes through the glass. Frequently these electrodes have substantial portions of their glass contacting surfaces spaced from the walls of the container or furnace for the glass to reduce the heat imposed on those walls and extend wall life. One electrode form involves a right circular cylinder which is extended through the bottom of the furnace. Although a number of expedients are employed to protect the electrode and the bottom refractory, it has been found that there is a tendency for electrodes to erode in the vicinity of the wall through which they pass.

In the case of the cylindrical electrodes cooling jackets have been mounted around the electrodes, beneath the furnace bottom to reduce the electrode temperature external of the furnace to a level at which it is not subject to attack by constituents of the atmosphere. Further, it is not uncommon to maintain an inert atmosphere within the jacket and around the electrode so it is protected in the portion of its length in which the temperature approaches that within the furnace. Even with such precautions electrodes tend to erode, usually in the vicinity of and slightly below the furnace floor-molten glass interface. Such erosion can result in the breaking off of the electrode in the melt.

Upon breaking an electrode, the furnace wall in the vicinity of the remaining stub portion is attacked and will develop leaks unless corrective action is taken promptly.

SUMMARY OF THE INVENTION

The present invention involves a method of and apparatus for monitoring apparatus for Joule effect heating molten materials to detect incipient electrode failure conditions and to indicate those conditions. Such indication enables corrective procedures to be timely undertaken.

An incipient electrode failure has been found to be indicated by an increase in the resistance between an electrode pair supplying electrical power for Joule effect heating.

One feature of the invention resides in sensing current and voltage in the circuit of an electrode pair to ascertain resistance and actuating an indicator in response to a predetermined resistance.

Another feature involves enhancing the accuracy of the resistance ascertained by sensing the r.m.s. values of current and voltage and employing them to ascertain resistance.

Another feature includes selectively associating a resistance measuring means for a Joule effect electrode pair with a plurality of such electrode pairs and an incipient failure indicator and an electrode pair indicator to identify the pair of the plurality for which the indicator is operated.

BRIEF DESCRIPTION OF THE DRAWINGS

FIG. 1 is a flow diagram of a procedure for monitoring for incipient electrode failure in a Joule effect heater for conductive heat softenable material; and FIG. 2 is a schematic representation of the plan of a glass melter having electrode pairs made up of individual electrode elements and having an electrode pair made up of electrodes having plural elements and the monitoring schematic wiring diagram for a typical pair of each type.

DESCRIPTION OF THE PREFERRED EMBODIMENTS

In accordance with the present invention it has been discovered that incipient failure of an electrode immersed in a fluid mass of heat softenable material to which it communicates electrical current for Joule effect heating is indicated by an increase in the resistance between electrode pairs carrying such current. This phenomena is believed due to erosion of the electrode to reduce its cross section and to the development of fractures in the necked down region of erosion.

Since a significant increase in resistance between electrode pairs has been observed as much as 24 hours in advance of an electrode failure, it has been deduced that the onset of the process ultimately resulting in failure is a decrease in cross sectional area along the electrode length. This decrease or necking down has most frequently been observed in the region of the electrode in the vicinity of its emersion from the refractory wall of the container for the molten material. Characteristically, the rate of increase of resistance increases with time. It has been found that a 20% increase is a reliable indicator of incipient trouble, hence such an increase has been employed as the criterion for actuating a trouble indicator.

It should be recognized that in long term campaigns of the Joule effect heated container some erosion of electrodes will be experienced over relatively long intervals. This long term erosion and the attendant long term increase in resistance between electrode pairs is not indicative of incipient electrode failure. Accordingly in the case of a glass melter for sodium-boro-silicate type glasses for the production of glass wool heated to a melting and refining temperature of about 2600° F, the resistance between vertical, right circular, cylindrical, molybdenum electrodes of 3 inches diameter extending through the furnace bottom and contacting the glass over about 20 inches of length is about 0.04 ohms when spaced six feet apart across the bottom.

A sensed increase of resistance of 0.05 ohms over a relatively short interval has been employed to indicate incipient failure. In order to minimize false indications the period of operation for which normal erosion resistance changes are not compensated has been about 3 months. Thus where resistance between electrode pairs is compared against a set point value that set point can be reset at 20 percent in excess of the then current resistance every 3 months.

Operation of an indicator according to this system can be employed to effect an automatic shutdown of power to the electrode pair at which the increased resistance is sensed. However, a preferred practice is to operate an alarm continuously until the alarm is acknowledged and to instruct responsible personnel to respond to the alarm by inspection of the electrodes, their circuits and the furnace to ascertain the cause of the change and either repair that cause, shut down power to the region in question or assure themselves that no problem exists.

A number of variables which influence electrode pair resistance exist for any given system to which the above method of monitoring is applied. In the case of glass a steep temperature coefficient of resistance exists in the range of temperatures of interest for melting, refining and working. Composition of the glass is also significant in determining resistance. Electrode size and condition as mentioned above also has an effect on resistance. In normal practice glass composition and temperature are stabilized and therefore can be disregarded. The initial electrode size is predetermined and the gradual change in size can be accommodated as it alters electrode pair resistance as outlined above. Thus a relatively abrupt change of electrode paiar resistance can be correlated with abrupt changes in electrode condition.

In practice Joule effect heating of glass is accomplished with a plurality of electrode pairs. The electrodes of these pairs can be made up of single or multiple elements. Effective monitoring of the system involves selectively monitoring the resistance of each of a plurality of electrode pairs. This is accomplished by scanning the pairs in a cyclical sequence. Where plural elements are employed for an electrode of a pair, the individual electrode elements can be scanned when paired with another electrode or electrode element. This element monitoring is desirable since the increase in resistance due to a change in an element's condition is masked by its parallel connected elements. Such parallel connected electrode elements tend to pick-up the current formerly carried by an associated element as that element deteriorates and increases its resistance.

Another factor which should be considered in monitoring electrode pair resistance is the interpair current flow and the complex waveshape of furnace input power from which the current and voltage values for indicating resistance are derived. The interpair current flow can be disregarded in a stable system. The waveshapes, particularly those developed by phase or time proportioned control of applied power deviate from pure sine form. Signals representing voltage and current can be processed to be true r.m.s. values for accurate electrode pair resistance determination. This is particularly true in the case of Joule effect heating of glass where essentially the entire impedance is resistive.

Where computer computation of resistance is involved the true r.m.s. values of current and voltage can be scaled to fit the computer's input requirements.

As represented in FIG. 1 monitoring for incipient electrode failure can be accomplished by developing a resistance value of an electrode pair including the electrode and by comparing that resistance with a set point which when matched actuates a failure responsive mechanism. Resistance is developed by ascertaining the voltage or a scaled portion thereof, applied across the electrode pair for Joule effect heating of the molten material being processed and ascertaining the current, or a scaled portion thereof, passed through the electrode pair. This voltage and current monitoring can be undertaken at the cables or conductors leading to the electrodes.

The illustrated comparison with a set point is convenient for automatic operation of an indicator, print out mechanism or process control change, however, even a direct indicator reading of a predetermined value of resistance can be employed as an incipient failure indication.

Apparatus for Joule effect heating of molten glass is shown in FIG. 2 with a multiple electrode pair monitor operated through automatic scanning, resistance value development, and indication of alarm levels, current values and voltage values for a code identified pair. A glass furnace 11 is shown with five electrode pairs 12, 13, 14, 15 and 16 projecting upwardly through its bottom 17 and immersed in molten glass 18. Each electrode of pair 16 has two electrode elements 21, 22 and 23, 24. Resistance monitoring is provided for pairs 12 through 15 and paired-electrode elements 21, 22 and 23, 24.

Each of electrode pairs 12 through 16 is coupled to a source of electrical power pulses of alternate opposite polarity as through parallel, oppositely poled SCRs 26 and 27 for pair 12 controlled by a firing control 28 which can be provided with current limiting means (not shown) for selective firing of the SCRs as alternating current is applied through power transformer 29. In the case of electrode pair 12, leads 31 and 32 convey the power to the electrodes. In the case of electrode pair 16, the electrode elements are connected to the source of alternating current power from secondary of transformer 33 through SCRs 34 and 35 having firing control 36 corresponding to 28. Parallel leads 37, 38 and 41, 42 respectively extend to electrode elements 21, 22 and 23, 24. Controled sources of power pulsations of opposite polarity (not shown) corresponding to the transformer 29, SCRs 26 and 27 and firing control 28 are provided for electrode pairs 13, 14 and 15.

Resistance for electrode pair 12 is ascertained by sensing voltage across the electrodes at leads 31 and 32 by means of transformer 44 having one side of its secondary grounded and the other side connected through lead 45 and contact 46 of relay R1 to bus 47. Bus 47 applies the voltage waveform to true r.m.s. to d-c converter 48, typically a 4128 true r.m.s. to d-c converter by Burr Brown.

The d-c scaled signal representing r.m.s. voltage is applied to computer 51 by leads 52 and 53 from converter 48 and processed in the computer with a scaled signal representing r.m.s. current to develop a resistance value for the electrode pair 12. Current supplied electrode pair 12 from the power source for Joule effect heating of the molten material 18 is sensed by current transformer 54 having windings around lead 32, which feeds a signal to transformer 55. In the scaling of the current signal, a resistor 56 is connected across the secondary of transformer 55 between its grounded end and lead 57 which passes the signal through contact 58 of relay R1 to the bus 59 connected to true r.m.s. to d.c. converter 61 corresponding to converter 48. The scaled d.c. signal representing r.m.s. current is passed by leads 62 and 63 to computer 51 for processing to a resistance value. The normal resistance value for an electrode pair can be established by calculation or by measurment.

When equilibrium processing conditions have been established in furnace 11, a resistance value can be developed by the computer from the ascertained r.m.s. voltage and r.m.s. current values. A set point is then established as an alarm threshold and set as one input value to a comparator internal of the computer. The other input to the comparator is the processed resistance value ($R = I/E$) derived from the r.m.s voltage and r.m.s current.

The converter functions of 48 and 61 and the processing functions of the computer 51 are employed for a plurality of electrode pairs where plural pairs are to be monitored. This is done on a time sharing or multiplexing basis as scheduled internally of the computer and the computer periodically issues an address code for the several circuits for which resistance is to be monitored. Typically an IBM 1800 computer employed for a number of other process monitoring and control functions is employed so that it is connected by multiplexing circuitry to the electrode pairs in succession. In the scan each electrode pair, evaluation typically involves an interval of about two seconds. Within this two second interval a r.m.s. voltage and r.m.s. current are read and a resistance calculation made. A coded output is then issued so that the multiplexing circuitry is connected to a next circuit to be evaluated. The computer can be arranged for continuous recycling of the scan of circuits subject to evaluation, for time spaced complete cycles of the scan, or for selective evaluation of certain circuits at more frequent intervals than for other circuits.

The circuit address codes are issued by computer 51 in four binary signals on leads 64, 65, 66 and 67 to decoder 68. Decoder 68 issues individual relay actuating signals to relays respectively having normally open contacts in their circuits between the voltage signal source and the r.m.s. converter 48 for voltage signals and the current signal source and the r.m.s. converter 61 for the electrode pair of the respective code. Thus relay R1 is energized to close contacts 46 and 58 and couple electrode pair 12 for resistance computation. In the same manner other pairs of electrodes are monitored by energizing relays in scan sequence. While the pair code is issued by computer 51, it also issues a pair code which can be digital or translated to another code such as a number or letter to the display 71 as at window 72 while current and voltage values are displayed at windows 73 and 74.

In the event of a resistance level which is excessive for the zone under surveillance at the time, an alarm indicator can be displayed as at window 75 and/or a typewriter print out or CRT display can be arranged to issue a message such as "electrode pair No. 1, turn off power and call supervisor."

Since the resistance between electrode pairs or electrode element pairs can be different, each pair can be provided with a separate set point. This set point is called out of the memory of computer 51 at the time that pair is under survelience. It can be offset appropriately (as at 120% of normal resistance) for the alarm threshold for indicating an electrode failure in the pair.

It will be noted that while the fifth pair 16 of electrodes or the fifth Joule effect heating zone as numbered from left to right in FIG. 2 has two elements in the form of closely spaced right-circular cylindrical rods extending vertically upward through the furnace bottom, the electrode elements are paired to enable monitoring of individual elements. Thus while a common source of power for Joule effect heating of zone 5 is coupled to the individual elements in electrical parallel, only one such element of each polarity is monitored in a scan interval. Elements 21 and 23 are monitored for their voltage at transformer 76 across leads 37 and 41 and their current at winding 77 in lead 37 to transformer 78. This monitoring is effective when addressed so that decoder 68 energizes relay R5 exclusively and closes contact 81 to the true r.m.s. converter 48 for voltage and contact 82 to the true r.m.s. converter 61 for current. At this time the computer calls up the set point resistance value across this pair of electrode elements and actuates the display. Further, a separate scan interval is provided for the pair of electrode elements 22, 24 of zone 5 when the computer sequences the address to energize relay R6.

Programing of the computer 51 can include an incipient electrode failure alarm subroutine. Such a subroutine holds the display in response to an alarm condition actuated in response to a resistance at the alarm threshold level. In this manner the electrode pair code of the pair indicating the alarm condition and the current and voltage sensed are held in display. Alternatively the computer can hold the address of the electrode pair indicating the alarm condition whereby the changes in current and voltage are displayed at 73 and 74 as they change subsequent to the onset of the alarm condition.

While the preceding discussion has disclosed specific conditions for electrode pairs operating in the magnitude of 3000 amperes at 150 volts for Joule effect heating of glass and thus about 0.05 ohms it is to be understood that it is applicable for other heat softenable materials having other electrical parameters for Joule effect heating. Further, it is to be appreciated that the computer functions suggested can be altered to provide other indications or control operations such as a reading of the actual resistance of an electrode pair. Accordingly the above disclosure is to be read as illustrative of the invention and not in a limiting sense.

I claim:

1. The method of monitoring for the incipient failure of electrodes employed in the Joule effect heating of molten glass comprising cyclically applying pulsations of voltage across the electrodes in electrical communication with the molten glass to achieve Joule effect heating of the glass; ascertaining the r.m.s. value of said voltage across the electrodes to be monitored; ascertaining the r.m.s. value of current flowing to the electrodes to be monitored; ascertaining the electrical resistance value based upon the ascertained r.m.s. voltage and r.m.s. current; and indicating an incipient electrode failure condition in response to a predetermined value of resistance.

2. The method according to claim 1 wherein said step of ascertaining the electrical resistance is performed at spaced time intervals; and wherein said step of indicating an incipient electrode failure condition is in response to a given change of resistance from a predetermined value.

3. The method according to claim 2 wherein the predetermined value of resistance is an increase of resistance of the order of 20 percent.

4. The method according to claim 1 including the steps of cyclically sampling the r.m.s. values of voltage and current.

5. The method according to claim 1 wherein a plurality of electrode pairs are subjected to a cyclical electrical power pulsation and are to be monitored; wherein the r.m.s. values of current and voltage across certain electrode pairs are sampled in a predetermined sequence cyclically; and including issuing an identifying indication of the electrode pair for which an incipient electrode failure condition is indicated.

6. The method according to claim 1 including establishing a set point for a resistance value; and indicating an incipient electrode failure condition when said ascertained resistance has a predetermined relationship to said set point value.

7. The method according to claim 5 including establishing a respective set point for the resistance value for each of said certain electrode pairs; comparing the ascertained resistance for each of said electrode pairs with the respective established set points for those pairs; and indicating an incipient electrode failure condition when the ascertained resistance for a certain pair has a predetermined relationship to the set point value for the respective pair.

8. The method according to claim 1 wherein the pulsations of voltage are applied across electrically paralleled electrode elements wherein a plurality of paralleled elements comprise an effective electrode of an electrode pair; wherein the value of current flowing to individual electrode elements is ascertained, wherein the electrical resistance value based upon the current flowing to individual electrode elements is ascertained; and wherein the indication of an incipient electrode failure condition is in response to the ascertained resistance based upon the current flowing to an individual electrode element.

9. Apparatus for monitoring for the incipient failure of electrodes employed in the melting of heat softenable material by Joule effect heating of the material comprising; a pair of electrodes adapted to be immersed in the heat softenable material; a source of electrical power; means connecting said source to said electrodes; means monitoring the voltage between said pair of electrodes; means monitoring the current supplied to one of said electrodes; means processing a resistance value based upon the monitored voltage and current from said monitoring means; and indicator means for alerting personnel of an incipient electrode failure condition in response to a predetermined resistance value.

10. Apparatus according to claim 9 wherein said current monitoring means includes a true r.m.s. to d.c. converter and wherein said voltage monitoring means includes a true r.m.s. to d.c. converter.

11. Apparatus for melting heat softenable material employing Joule effect heating of the material comprising; at leat a first and second pair of electrodes adapted to be immersed in the heat softenable material; a source of electrical power; means connecting said source to said electrodes; at least a first and second means respectively monitoring the voltage between said first pair of electrodes and said second pair of electrodes; at least a first and second means respectively monitoring the current supplied to one of said electrodes of said first pair and one of said electrodes of said second pair; means to scan, concurrently said respective voltage and current monitoring means for each of a plurality of pairs of said electrodes; means processing a resistance value based upon the monitored voltage and current from said monitoring means and means issuing a signal in response to a predetermined resistance value.

12. Apparatus according to claim 11 including means responsive to said scanning means to issue a signal for respective resistance values predetermined for the individual pairs of said electrodes.

13. Apparatus according to claim 11 including means responsive to said scanning means to issue an electrode pair identification signal for respective individual pairs of said electrodes in response to resistance values predetermined for the respective individual pairs of said electrodes.

14. The method of monitoring for the incipient failure of electrodes employed in the Joule effect heating of molten glass comprising cyclically applying pulsations of voltage across the electrodes in electrical communication with the molten glass to achieve Joule effect heating of the glass; ascertaining the value of said voltage across the electrodes to be monitored; ascertaining the value of current flowing to the electrodes to be monitored; ascertaining the electrical resistance value based upon the ascertained voltage and current; and indicating an incipient electrode failure condition in response to a predetermined value of resistance.

15. The method of ascertaining a change in the geometric relationship between a mass of molten glass and a first electrode immersed in the molten glass and employed in heating the glass by Joule effect, comprising cyclically applying pulsations of voltage between the first electrode and a second electrode spaced from said first electrode and immersed in the glass across a path of molten glass; ascertaining the value of voltage across the first and second electrodes; ascertaining the value of current flowing between the first and second electrodes; ascertaining the electrical resistance value based upon the ascertained voltage and current; and indicating a change in the geometric relationship between said first electrode and said molten glass in response to a predetermined value of resistance.

16. The method according to claim 15 including the steps of conditioning the mass of molten glass for the production of a useful product; ascertaining the electrical resistance value based upon the ascertained voltage and current present during a first period of the conditioning of the mass for the production of a useful product; ascertaining the electrical resistance value based upon the ascertained voltage and current while the mass is conditioned for the production of useful product at a time subsequent to the first period; and indicating the change in geometric relationship in response to a predetermined change in the ascertained value of resistance.

17. The method according to claim 16 wherein the step of indicating a change in geometric relationship is in response to an increase in the value of resistance.

18. The method according to claim 17 wherein the step of indicating a change indicates a reduction in the effective area of the first electrode in contact with the molten glass.

19. The method according to claim 18 wherein the reduction in effective area is a reduction in the perimeter length of cross sections of the first electrode.

* * * * *